United States Patent
Yang et al.

(10) Patent No.: US 8,008,988 B1
(45) Date of Patent: Aug. 30, 2011

(54) RADIO FREQUENCY SWITCH WITH IMPROVED INTERMODULATION DISTORTION THROUGH USE OF FEED FORWARD CAPACITOR

(75) Inventors: Xiaomin Yang, Sanford, FL (US); Thomas Meier, Starnberg (DE)

(73) Assignee: Triquint Semiconductor, Inc., Orlando, FL (US)

( * ) Notice: Subject to any disclaimer, the term of this patent is extended or adjusted under 35 U.S.C. 154(b) by 252 days.

(21) Appl. No.: 12/177,469

(22) Filed: Jul. 22, 2008

Related U.S. Application Data (60) Provisional application No. 61/030,032, filed on Feb. 20, 2008.

(51) Int. Cl.
*H01P 1/10* (2006.01)
(52) U.S. Cl. .................................. 333/101; 333/105
(58) Field of Classification Search ............... 333/101, 333/103
See application file for complete search history.

(56) References Cited

U.S. PATENT DOCUMENTS

| | | | |
|---|---|---|---|
| 6,642,578 B1 * | 11/2003 | Arnold et al. ............. 257/341 |
| 7,345,521 B2 * | 3/2008 | Takahashi et al. ......... 327/308 |
| 7,345,545 B2 * | 3/2008 | Glass et al. ............... 330/277 |
| 7,492,209 B2 * | 2/2009 | Prikhodko et al. ........ 327/384 |
| 7,492,238 B2 * | 2/2009 | Nakatsuka et al. ........ 333/103 |
| 2004/0141470 A1 | 7/2004 | Kelcourse et al. |
| 2005/0170806 A1 | 8/2005 | Kim |
| 2005/0179506 A1 * | 8/2005 | Takahashi et al. ........ 333/104 |
| 2006/0039505 A1 | 2/2006 | Kim |
| 2007/0173220 A1 | 7/2007 | Kim et al. |
| 2007/0247211 A1 | 10/2007 | Brindle |

OTHER PUBLICATIONS

Ranta, Tero, Ella, Juha, and Pohjonen, Helena; Antenna Switch Linearity Requirements for GSM/WCDMA Mobile Phone Front-Ends; 8th European Conference on Wireless Technology Proceedings; Paris, France, Oct. 2005; pp. 23-26.

* cited by examiner

*Primary Examiner* — Robert Pascal
*Assistant Examiner* — Alan Wong
(74) *Attorney, Agent, or Firm* — Allen, Dyer, Doppelt, Milbrath & Gilchrist, P.A.

(57) ABSTRACT

A radio frequency (RF) switch using a field effect transistor has $2^{nd}$ order intermodulation distortion improved through use of a feed forward capacitor electrically connected between the gate and a voltage coupler connected between the source and drain of the FET. With a control voltage provided at the gate through a gate feed resistor for operation of the FET, the feed forward capacitor feeds an RF voltage from the drain terminal and the source terminal to the gate terminal through the gate feed resistor.

20 Claims, 11 Drawing Sheets

*FIG. 1*

*PRIOR ART*

RADIO FREQUENCY SWITCH WITH IMPROVED INTERMODULATION DISTORTION THROUGH USE OF FEED FORWARD CAPACITOR

CROSS REFERENCE TO RELATED APPLICATION

This U.S. Utility Patent Application claims priority to U.S. Provisional Patent Application having Ser. No. 61/030,032 filed Feb. 20, 2008 for "RE Switch with Improved Intermodulation Distortion by Use of Feed Forward Capacitor," the disclosure of which is hereby incorporated herein in its entirety by reference.

FIELD OF THE INVENTION

This invention generally relates to radio frequency (RF) switches and in particular to $2^{nd}$ order intermodulation distortion (IMD2) improvement of an RF switch.

BACKGROUND OF THE INVENTION

An antenna switch is an important component in the "front-end" of a multi-mode mobile phone. A typical 3G phone operates in one or more WCDMA bands as well as in traditional GSM bands. A multi-mode multi-band linear switch in many cases is used as a main switch to route both GSM and WCDMA bands to the same antenna. An antenna switch operating in WCDMA bands needs to have relatively high linearity for full-duplex WCDMA signals. The most demanding antenna switch linearity requirement for WCDMA system is the out-of-band blocking tests. By way of example, reference is made to T. Ranta, J. Ellä and H. Pohjonen, "Antenna Switch Linearity Requirements for GSM/WCDMA Mobile Phone Front-Ends," 8th European Conference on Wireless Technology Proceedings, Paris, France, October 2005, pp. 23-26, the disclosure of which is herein incorporated by reference in its entirety. The test includes injecting an interferer signal (−15 dBm) into antenna while transmitting TX signal (+20 dBm). A spectrum analyzer is used to measure the intermodulation product that falls on its RX band. The purpose of a blocking test is to measure a receiver's ability to receive a wanted signal in the presence of an unwanted interferer (blocker) without causing degradation on the receiver sensitivity. Dominating out-of-band blocking mechanisms in an antenna switch are due to $2^{nd}$ and $3^{rd}$ order intermodulation distortion (IMD2 and IMD3) herein described as:

IMD2 low: $f_{interferer} + f_{TX} = f_{RX}$

IMD2 high: $f_{interferer} - f_{TX} = f_{RX}$

IMD3: $2f_{TX} - f_{interferer} = f_{RX}$

Here $f_{TX}$ is the TX frequency, $f_{interferer}$ is the interferer (blocker) frequency, and $f_{RX}$ is the RX frequency. If the antenna switch is not sufficiently linear, it may corrupt the noise floor and desensitize the receiver. The IMD3 usually can be improved by applying a higher voltage at the gate. The application of the voltage boost circuit or DC-DC converter provides a doubled or tripled voltage out of the typical supply voltage of 2.8V. The available higher voltage makes an IMD3 specification requirement an easier task to meet. However IMD2 is mainly due to the asymmetry of the switch and normally does not benefit much from a higher voltage.

SUMMARY OF THE INVENTION

In view of the foregoing background, the invention is directed to improvements in IMD2. Embodiments of the invention include the use of feed forward capacitors. The invention may comprise a radio frequency (RF) switch including a field effect transistor (FET), wherein a single feed forward capacitor is connected between the gate terminal and an electrical coupling of the drain and source terminals. By way of example, one embodiment of the invention may include a radio frequency (RF) switch comprising a FET having a drain terminal, a source terminal, and a gate terminal. A control voltage source provides a DC bias voltage to the gate terminal for operation of the FET. The switch may include resistor elements connected between the gate terminal and the control voltage source. A voltage divider may be connected between the drain terminal and the source terminal and a feed forward capacitor is connected between the gate terminal and the voltage divider. The feed forward capacitor feeds the RF voltage from the drain terminal and the source terminal to the gate terminal though a gate resistor.

BRIEF DESCRIPTION OF THE DRAWINGS

For a fuller understanding of the invention, reference is made to the following detailed description, taken in connection with the accompanying drawings illustrating various embodiments of the present invention, in which:

FIGS. 5, 5A and 5B illustrate switch embodiments in keeping with the teachings of the present invention, wherein the switch includes a feed forward cap C1 feeding RF voltage Vr from the drain-source to the gate of a FET through a resistor R1, and wherein

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

A linear system can be expressed as $y(t)=c_1 x(t)$, while a nonlinear system with 2nd and 3rd order distortion can be expressed as: $y(t)=c_1 x(t)+c_2 x^2(t)+c_3 x^3(t)$, where $c_2, c_3 \neq 0$. With a two-tone input signal in the form of $x(t)=A_1 \sin(\omega_1 t)+A_2 \sin(\omega_2 t)$, the output of the above nonlinear system becomes:

$$y(t)=c_1 x(t)+c_2 x^2(t)+c_3 x^3(t)=c_1[A_1 \sin(\omega_1 t)+A_2 \sin(\omega_2 t)]+c_2[A_1 \sin(\omega_1 t)+A_2 \sin(\omega_2 t)]^2+c_3[A_1 \sin(\omega_1 t)+A_2 \sin(\omega_2 t)]^3$$

Therefore, the amplitude of the $2^{nd}$ order distortion at frequency ($\omega_1 \pm \omega_2$) is $|c_2 A_1 A_2|$. To achieve the least $2^{nd}$ order distortion, we want the coefficient $c_2$ to be as small as possible, ideally $c_2=0$. When the coefficient $c_1>0$, minimizing the $2^{nd}$ order distortion means the transfer function has to be both linear and symmetrical in the $1^{st}$ and $3^{rd}$ quads.

Figure 1:
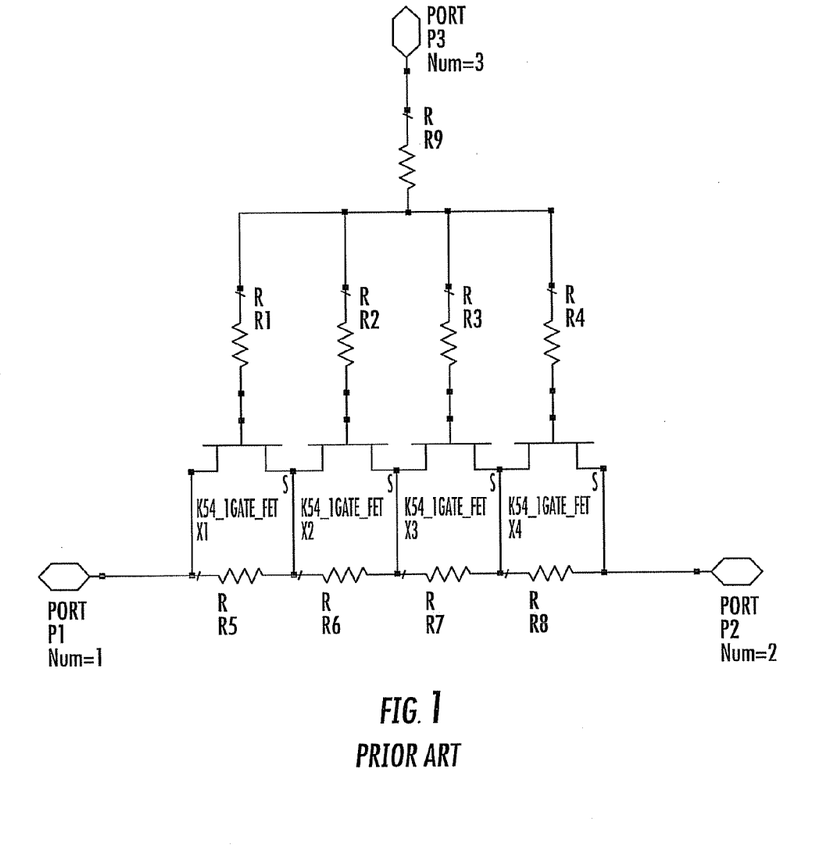
FIG. 1 is a schematic drawing of an antenna switch including four field effect transistors (FETs) in series.
Figure 2:
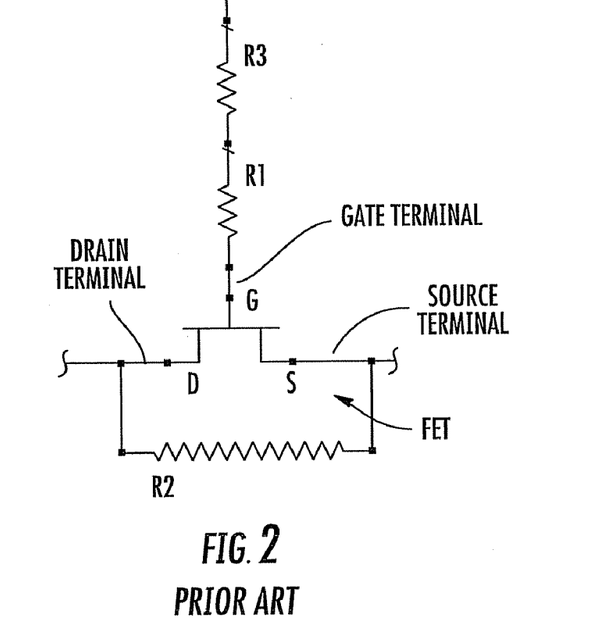
FIG. 2 is a single series FET in the switch shown in FIG. 1.
Figure 3:
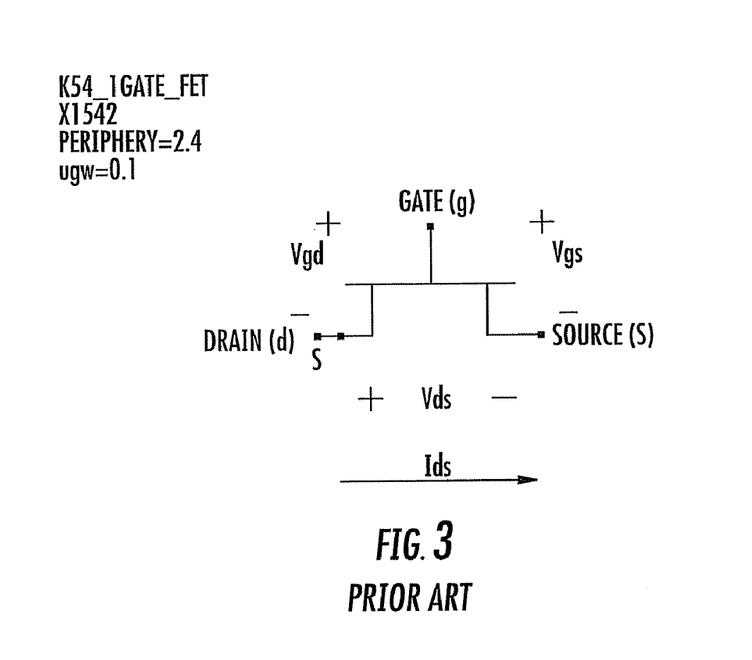
FIG. 3 is a schematic symbol of a FET.

Consider one antenna switch comprising four FETs connected in series as illustrated with reference to FIG. 1. A single series FET of FIG. 1 is illustrated with reference to FIG. 2. A schematic symbol of the FET is illustrated with reference to FIG. 3.

Figure 4:
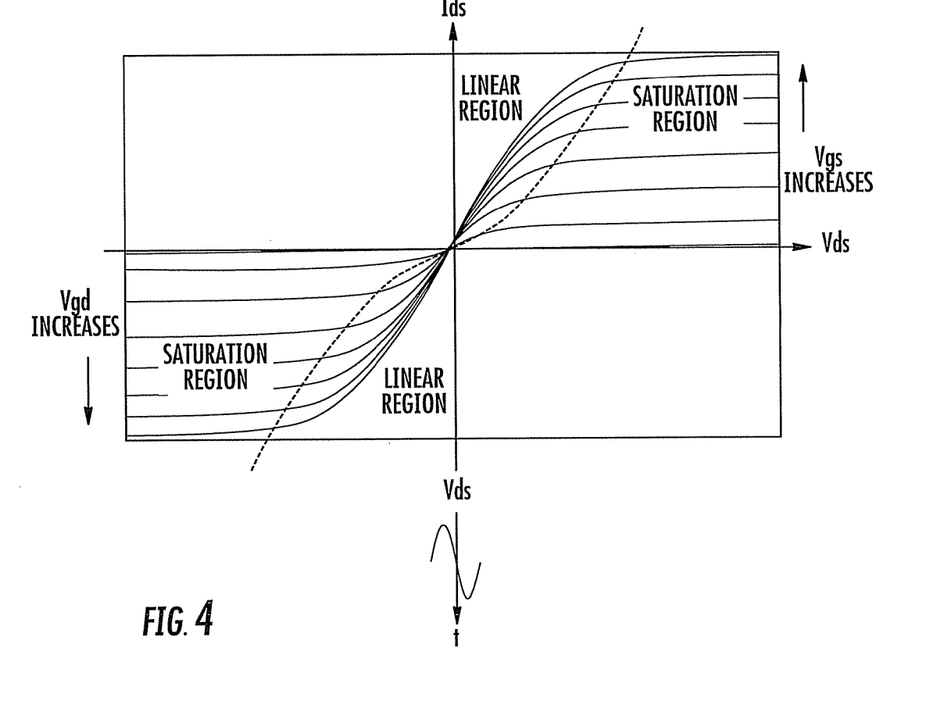
FIG. 4 illustrates current-voltage (I-V) characteristics of a channel.
Figure 7:
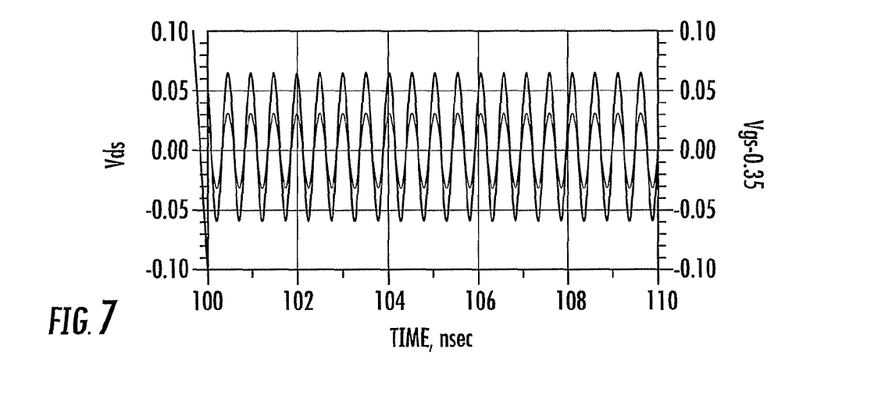
FIG. 7 is a plot of voltage versus time illustrating an amplitude of the RF voltage swing across the gate-source (or gate-drain) being approximately one half of the RF voltage swing across drain-source.

With continued reference to FIG. 1. a control voltage at the gate turns each FET on or off. To achieve improved and desirable linearity, each FET needs to be linear within its operational range. Now consider each series FET in the switch path as a nonlinear system, and the input $x=V_{ds}$ (drain-source voltage), output $y=I_{ds}$ (drain-source current) in the system transfer function. In blocking tests (two-tone tests), both TX and interfere signals were presented. The amplitude of IMD2 equals $|c_2 A_1 A_2|$, where $A_1$ and $A_2$ are the magnitudes of the TX and interferer signals. FIG. 4 illustrates a family of $I_{ds}$ versus $V_{ds}$ curves for a single series FET. In an RF switch, to achieve an improved IMD2 ($2^{nd}$ order distortion), the FET is operated in the linear region during the RF voltage swing. The $1^{st}$ quadrant is the FET characteristics during the positive voltage swing when $V_{ds}>0$, while the $3^{rd}$ quadrant is the FET characteristics during the negative voltage swing when $V_{ds}<0$. Increasing the control voltage will bias the gate at a higher voltage, which results in higher $I_{dss}$ (drain-source current $I_{ds}$ in saturation) and further extend the linear region. A resistor is connected between the drain and source terminals of the FET to minimize the voltage swing $V_{ds}$ across drain and source, so that the FET can stay in the linear region. Reference is made to FIG. 7, wherein a plot of voltage versus time illustrates amplitude of the RF voltage swing across the gate-source (or gate-drain) being approximately one half of the RF voltage swing across drain-source. It is also desirable for $V_{gs}$ ($V_{gd}$) to be constant during positive (negative) voltage swings. It is further desirable for $V_{gs}$ and $V_{gd}$ to have the same magnitude but be 180 degrees out of phase to ensure symmetry in quadrants 1 and 3.

To reduce the $V_{gs}$ ($V_{gd}$) swing during a positive (negative) voltage swing, it is desirable to minimize the gate current $I_g$, since $I_g$ is proportional to the derivative of $V_{gs}$ $$(V_{gd}): \frac{dV_{gs}}{dt} = \frac{I_g}{C_{gs}}.$$

The symmetry of the $I_{ds}$–$V_{ds}$ during both positive and negative voltage swings allows the switch to achieve a good IMD2. It requires $V_{gs}$ and $V_{gd}$ to have the same magnitude but 180 degree out of phase. In this example, for an ON FET of 2.4 mm periphery biased at $V_{gs}$ of 0.3~0.4V, the intrinsic $C_{gs}$ is around 3~4 pF. The large time constant ($C_{gs}$ and the gate resistance) enables the gate voltage $V_g$ to follow the RF voltage swing of $V_d$ (voltage at the drain terminal) and $V_s$ (voltage at the source terminal). This keeps the FET on during the negative voltage swing of TX input. Analysis shows that the amplitude of the RF voltage swing across gate-source (or gate-drain) is approximately one half of the RF voltage swing across drain-source.

Figure 5:
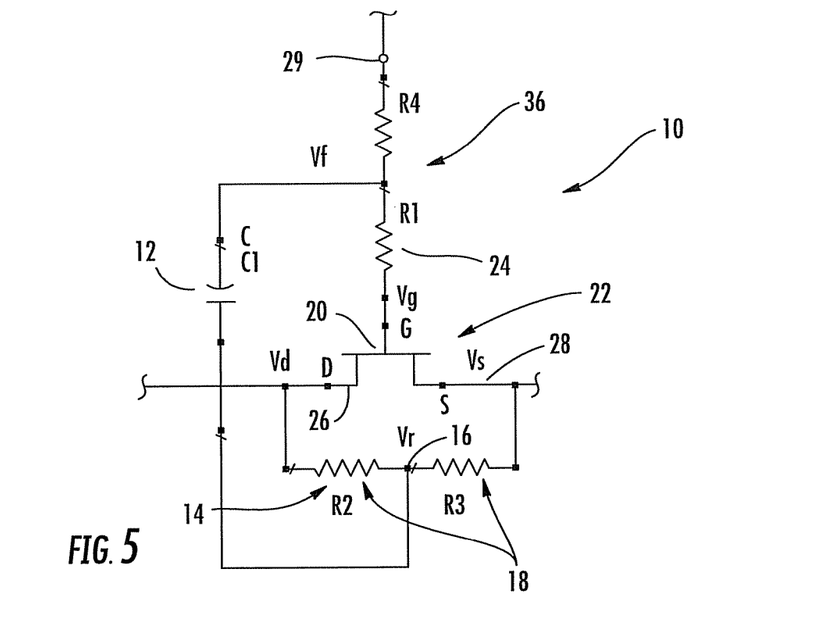
Figure 5A:
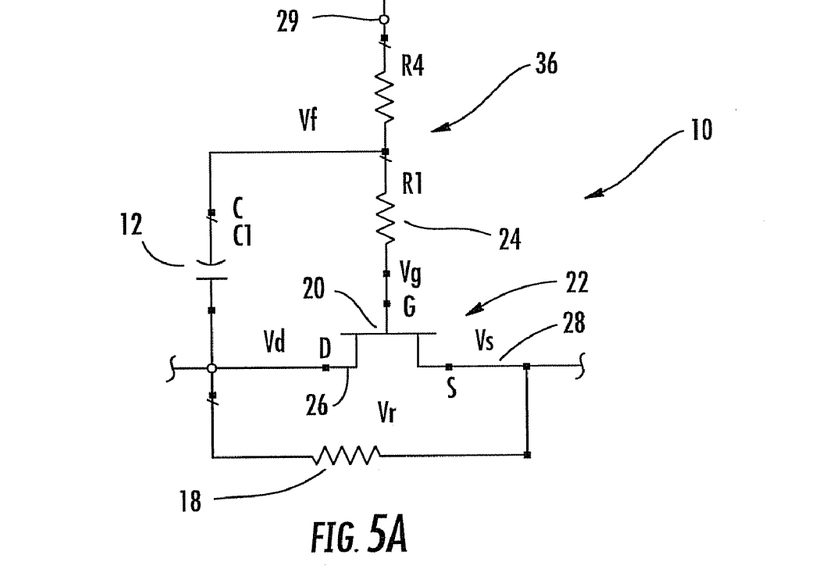
Figure 5B:
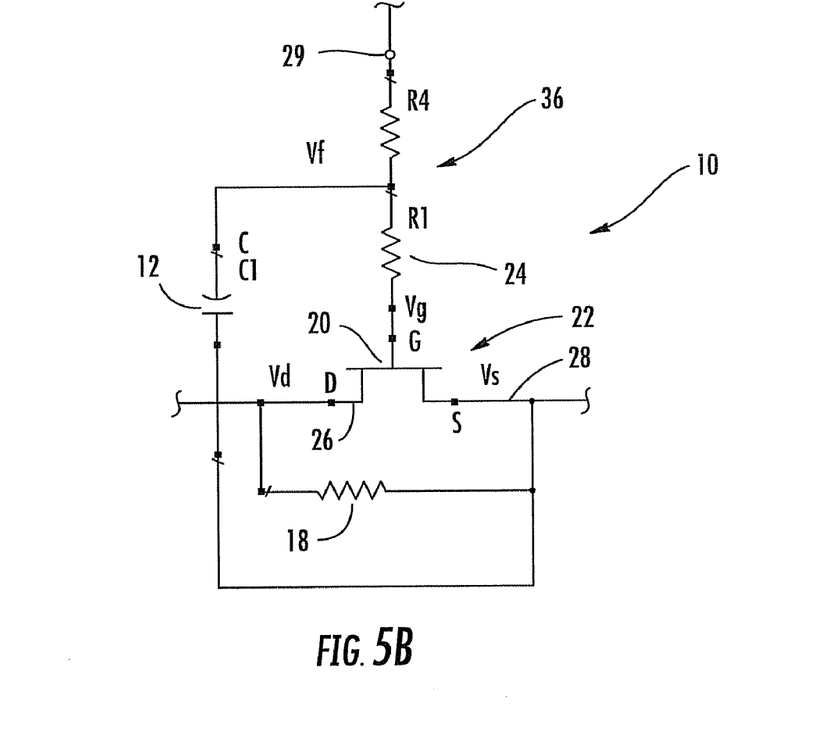

With reference to FIG. 5, one embodiment of a switch 10 in keeping with the teachings of the present invention, includes a feed forward capacitor $C_1$ 12 feeding an RF voltage Vr from a voltage divider 14 taken from a point 16 of a drain-source resistor 18 of the voltage divider to a gate 20 of a FET 22 through a resistor $R_1$ 24. The voltage swing of Vr will be proportional and may also be half (depending upon point 16 of contact) of the voltage swing across a drain 26 to source 28 of the FET. A capacitor $C_f$ 12 is used to ensure fast charging/discharging so that voltage $V_f$ tracks voltage $V_r$ changes or swings. Therefore $V_f = V_g$, and as a result the RF voltage across $R_1$ is approaches zero. The gate current is then desirably minimized. A control voltage source 29 provides a DC bias voltage to the gate terminal for operation of the FET In one embodiment, as illustrated with reference again to FIG. 5, the voltage divider 14, comprising two resistors 18A, 18B, is connected between the drain terminal 26 and the source terminal 28. The feed forward capacitor $C_1$ 12 feeds an RF voltage Vr from the voltage divider 14 to the gate 20. The capacitor 12 is between a point 16 of the voltage divider 14 forming a drain-source resistor 18 and the gate 20 of the FET 22 through the resistor $R_1$ 24. However, a connection of $C_1$ 12 directly from either the drain 26 or the source 28 terminals through the resistor $R_1$ 24 to the gate 20 can be used to practice the present invention without departing from its spirit or scope, as illustrated with reference to FIGS. 5A and 5B.

Figure 6:
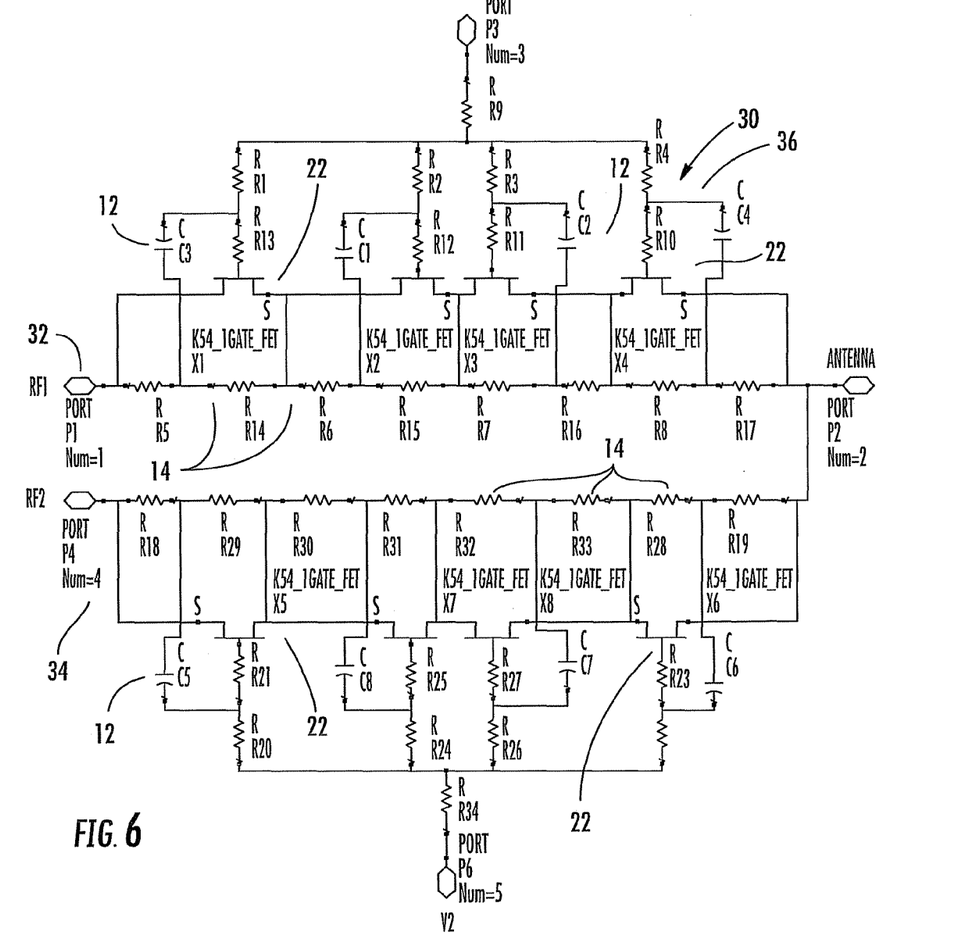
FIG. 6 is a schematic drawing of one single pole double throw (SPDT) switch with feed-forward capacitors for IMD2 improvement.

By way of example, one embodiment of the invention includes a single pole double throw (SPDT) linear switch 30 illustrated with reference to FIG. 6. For the embodiment herein described by way of example, each switch throw 32, 34 including four single gate FETs 22 connected in series is illustrated. Measurements show 4 dB improvement on a Band 1 IMD2 (low) performance.

It will be recognized by those skilled in the art that feed forward capacitors 12 have been used in the RF switches to improve harmonic performance. Reference is made to Arnold et al. for "Linearity Radio Frequency Switch with Low Control Voltage", U.S. Pat. No. 6,642,578 B1 by way of example, the disclosure of which is herein incorporated by reference in its entirety. As described in Arnold '578, and herein with reference to FIG. 5C, two feed forward capacitors $C_{ff}$ were usually used in this case. One capacitor was connected from the drain of the multi-gate FET to its first gate, and a second capacitor was connected from the source of the multi-gate FET to its last gate. The function of such feed forward capacitors was additional to the intrinsic capacitance of the FET (Cgd or Cgs) to keep the FETs in an off state and from turning on during the RF voltage swings.

As above described, the present invention is directed to improvements in the IMD2 performance of the RF switches. Embodiments of the invention may be differentiated from know devices and methods by including features herein disclosed, taken alone or in combination. By way of distinction, one embodiment of the invention herein described by way of example includes a single gate FET 22. Well known devices typically employ multi-gate FETs, as illustrated with reference again to Arnold '578.

For the embodiment of the invention illustrated herein with reference to FIG. 5, the feed forward capacitor 12 is applied around the FET 22. Typically, feed forward capacitors are connected from either the drain or the source to one of the gate lines. Again, reference is made to Arnold '578, by way of example. Typically, capacitors were connected directly to the gates without a resistor in between. For one embodiment herein illustrated by way of example with reference again to FIGS. 5 and 6, the feed forward capacitor 12 is electrically coupled from the voltage divider 14 across its own (the FET 22) drain 26 and source 28 to a gate biasing circuit 36. Further, there, is a resistor 24 (in kohm scale) between the feed forward capacitor 12 and the gate 20. As will be clear to those of skilled in the art, the resistor 24m may be in a form of parallel resistors as illustrated with reference to FIG. 5D for multi-gate FET 22m.

Figure 5C:
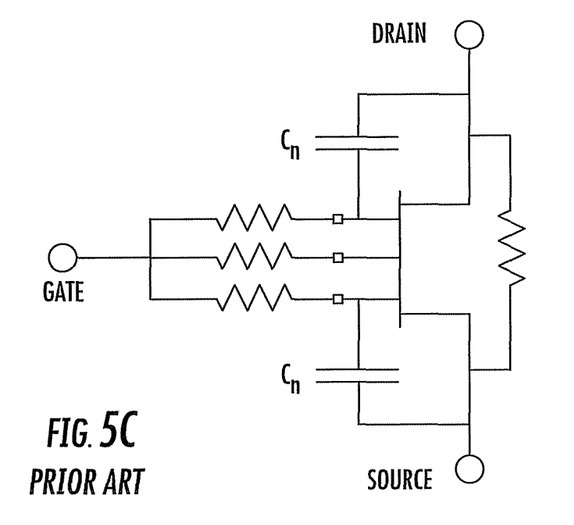
FIGS. 5C and 5D illustrate multi-gate FET embodiments for a known embodiment and one in keeping with the teachings of the present invention, respectively.
Figure 5D:
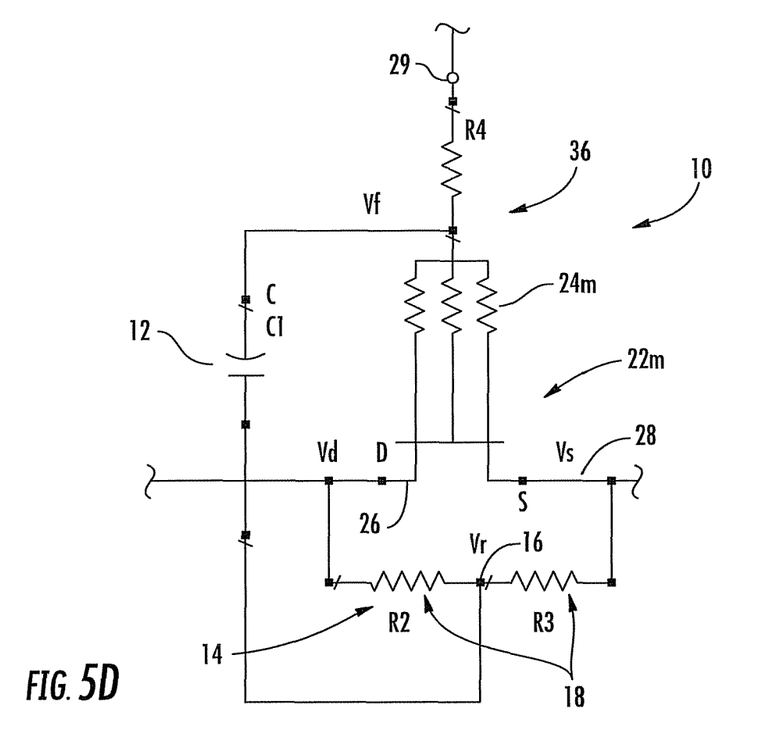

By way of further comparison to known techniques and using above referenced FIG. 5C for Arnold '578 by way of example, two capacitors were typically used for each series multi-gate FET in a switch, no matter how many gate lines were included. As herein illustrated for embodiments of the invention, only a single and dedicated feed forward capacitor 12 is used for each single gate device or multi-gate device, as illustrated with reference again to FIGS. 5 and 5D.

Further, the feed forward capacitors 12 employed in the embodiments of the invention provide different functions in the switch then typically provided in known devices. Typically, feed forward capacitors are used as additions to an intrinsic capacitance of the FET to keep a FET in an off mode from partially turning on, as above described. Embodiments of the invention employ feed forward capacitors 12 to minimize gate currents in both on and off FETs 22.

Figure 8A:
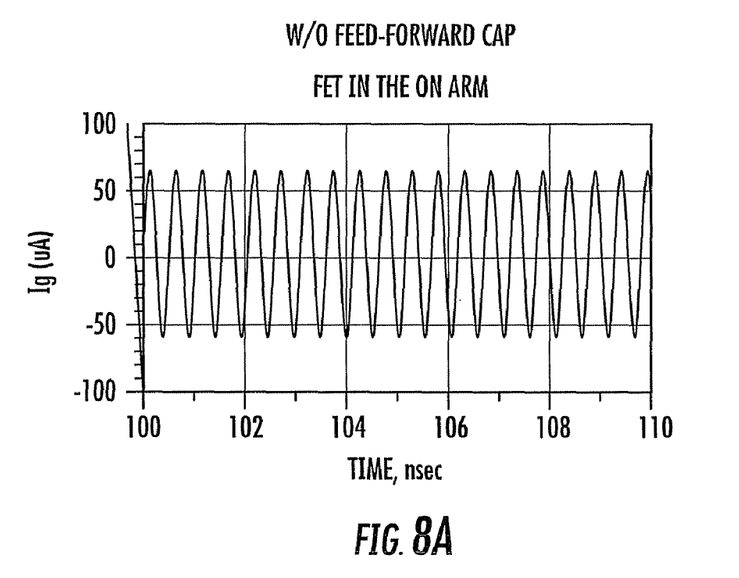
FIGS. 8A and 8B are plots of gate leakage current for an ON FET and an OFF FET without the use of a feed forward capacitor as taught by the present invention.
Figure 8B:
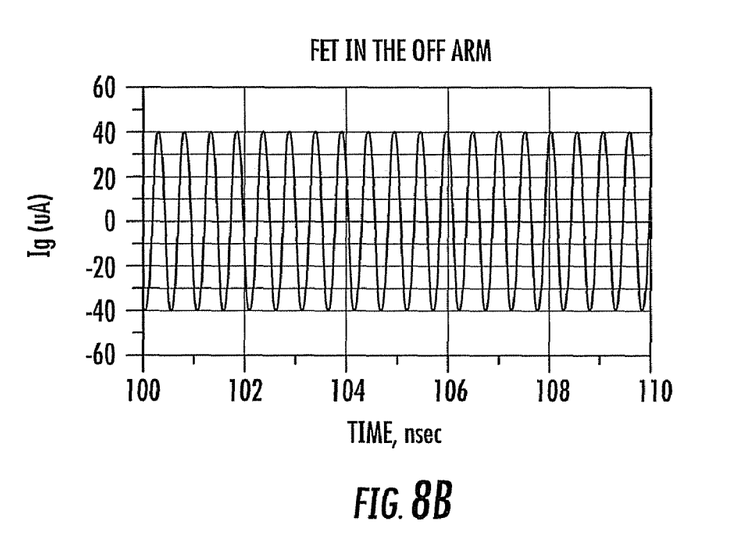
Figure 9A:
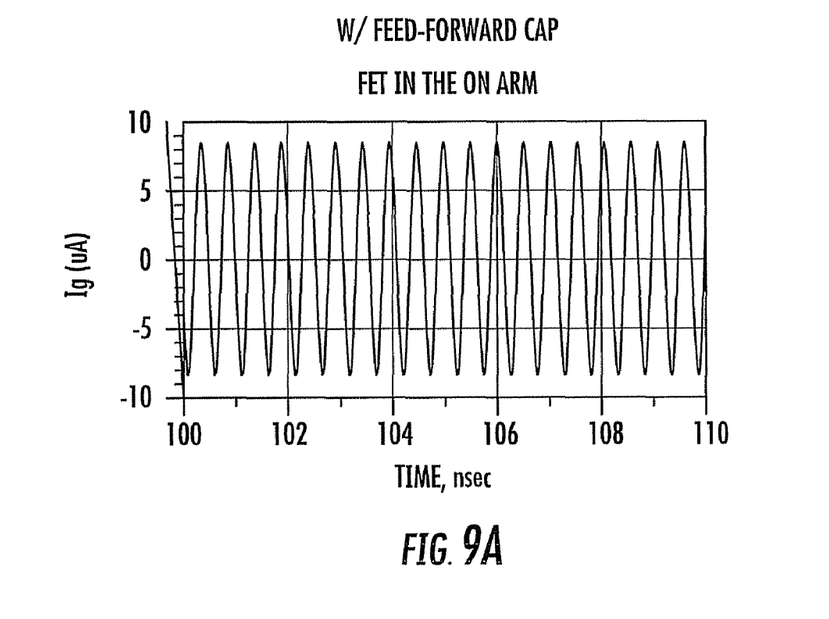
FIGS. 9A and 9B are plots of gate leakage current for an ON FET and an OFF FET employing the feed forward capacitor as illustrated in the SPDT embodiment of FIG. 6, the gate leakage current clearly seen as being much reduced when using feed forward capacitors.
Figure 9B:
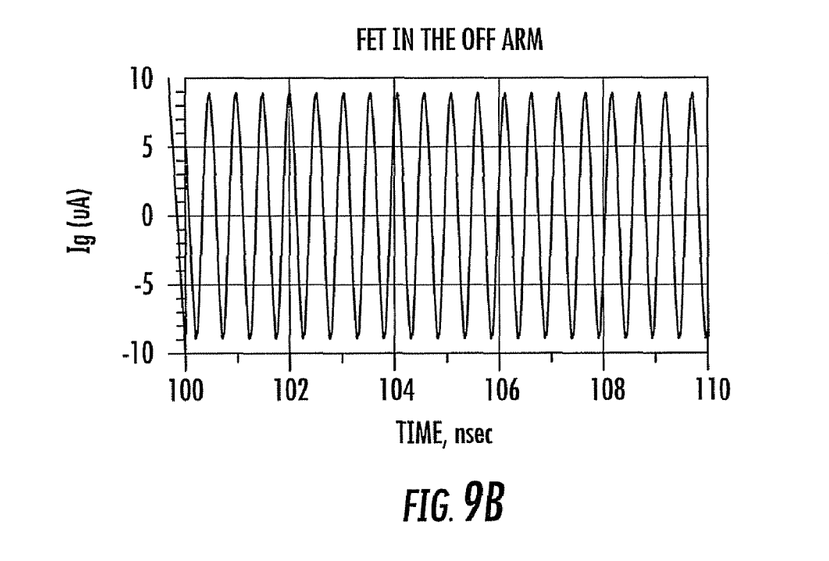
Figure 10A:
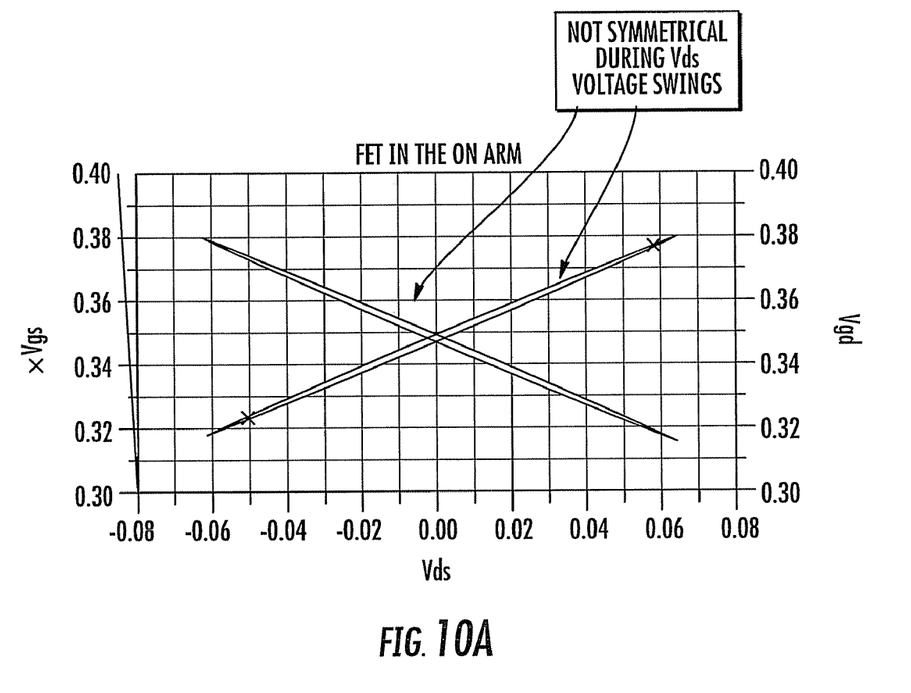
FIGS. 10A and 10B illustrate voltage responses without the feed forward capacitors, noting Vgs and Vgd are not symmetrical during voltage swings.
Figure 10B:
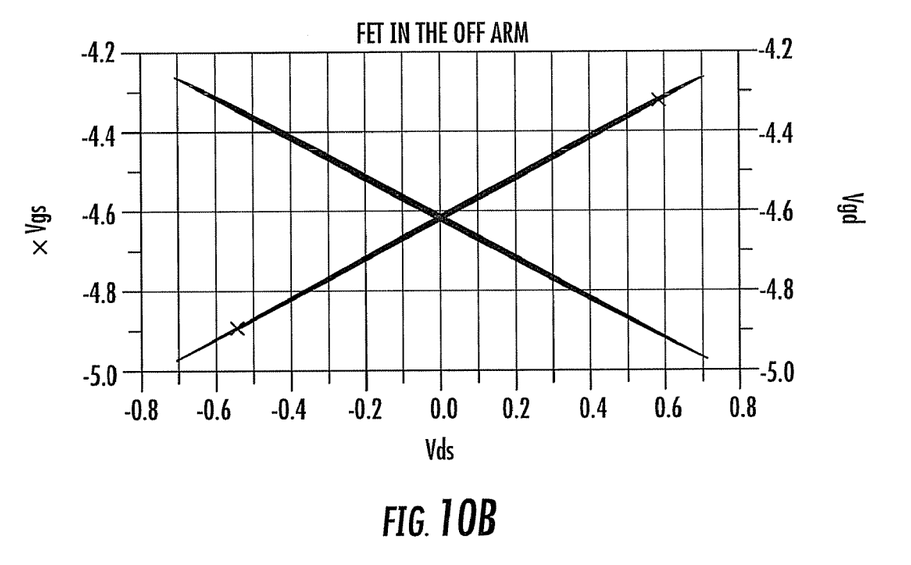
Figure 11A:
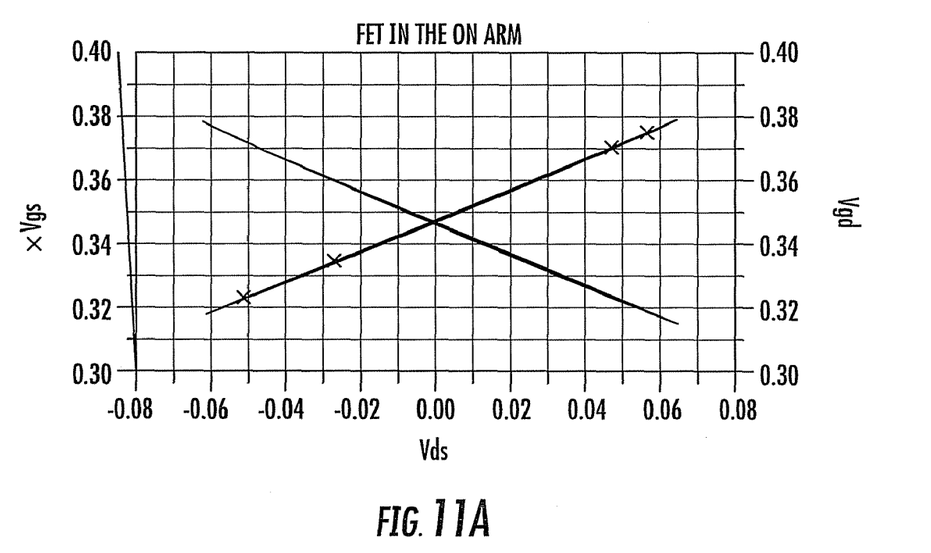
FIGS. 11A and 11B illustrate voltages responses as in FIGS. 10A and 10B but with the use of feed forward capacitors, noting Vgs and Vgd achieve desirable symmetry during voltage swings.
Figure 11B:
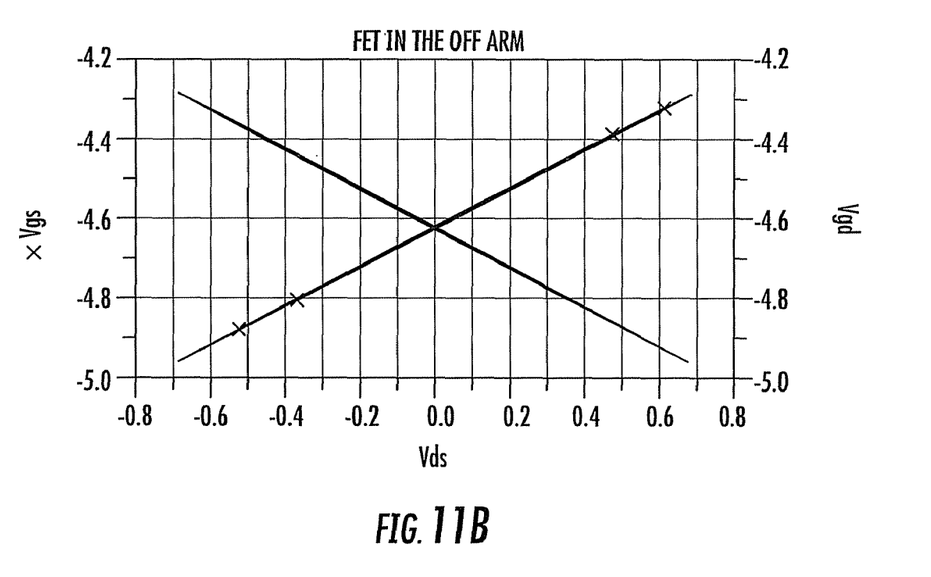

Results of using the feed forward capacitor as herein illustrated have shown success. By way of example, FIGS. 8A and 8B are plots of gate leakage current for an ON FET and an OFF FET without the use of a feed forward capacitor as taught by the present invention. FIGS. 9A and 9B are plots of gate leakage current for an ON FET and an OFF FET employing the feed forward capacitor as illustrated in the SPDT embodiment of FIG. 6, the gate leakage current clearly seen as being much reduced when using feed forward capacitors. FIGS. 10A and 10B illustrate voltage responses without the feed forward capacitors, noting Vgs and Vgd are not symmetrical during voltage swings. FIGS. 11A and 11B illustrate voltages responses as in FIGS. 10 A and 10B but with the use of feed forward capacitors, noting Vgs and Vgd achieve desirable symmetry during voltage swings.

Figure 12:
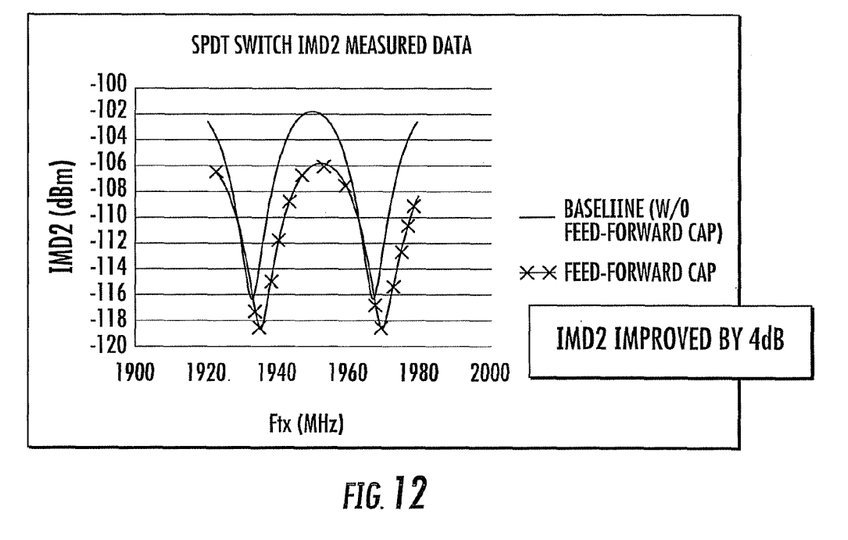
FIG. 12 is a response with feed forward capacitors, illustrating the IMD2 in the SPDT switch of FIG. 6 improved by 4 dB.

A desirable result is achieved in the switch 10 when constructed in embodiments as above described. In particular, significant improvements in $2^{nd}$ order intermodulation distortion (IMD2) of an RF switch is achieved as illustrated with reference to FIG. 12 illustrated by a response with feed forward capacitors in the SPDT switch 30 of FIG. 6. By way example for the switch herein illustrated, the $2^{nd}$ order intermodulation distortion (IMD2) is improved by 4 dB.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A radio frequency switch comprising:
    a field effect transistor (FET) having a drain terminal, a source terminal, and a gate terminal;
    a resistor element network connected to the gate terminal, the resistor element network comprising at least two resistors including a gate resistor;
    a control voltage source providing a DC bias voltage to the gate terminal for operation of the FET through the resistor element network;
    a voltage divider electrically connected between the drain terminal and the source terminal; and
    a dedicated feed forward capacitor electrically connected between the resistor element network connected to the gate terminal and the voltage divider, wherein the dedicated feed forward capacitor feeds a modified RF voltage from the drain terminal and the source terminal to the gate terminal through the gate resistor element network without affecting the DC bias voltage applied thereto.

2. A switch according to claim 1, wherein an RC constant of the dedicated feed forward capacitor and the resistor element network connected to the gate is optimized to ensure a proper charging and discharging thereof for allowing the modified RF voltage from the drain terminal and the source terminal to closely track an RF voltage delivered to the gate terminal.

3. A switch according to claim 1, wherein the voltage divider comprises first and second resistors in a series connection between the source terminal and the drain terminal, and wherein the dedicated feed forward capacitor is connected between the first and second resistors.

4. A switch according to claim 1, wherein the FET is a single gate FET.

5. A switch according to claim 1, wherein the FET is a multi-gate FET.

6. A radio frequency (RF) switch comprising:
    a field effect transistor (FET) having a drain terminal, a source terminal, and a gate terminal; and
    a gate resistor connected to the gate terminal;
    a dedicated feed forward capacitor electrically connected between the gate resistor and an electrical coupling of the drain and source terminals of the FET, wherein the dedicated feed forward capacitor feeds a modified RF voltage from the drain terminal and the source terminal to the gate terminal through the gate resistor without affecting a DC bias voltage applied thereto.

7. A switch according to claim 6, further comprising a control voltage source and resistor element network providing the DC bias voltage to the gate terminal for operation of the FET, the resistor element network including the gate resistor, wherein the dedicated feed forward capacitor feeds the modified RF voltage to the gate terminal from the electrical coupling through the gate resistor.

8. A switch according to claim 6, wherein the electrical coupling comprises a voltage divider electrically connected between the drain terminal and the source terminal.

9. A switch according to claim 8, wherein the voltage divider comprises first and second resistors in a series connection between the source terminal and the drain terminal, and wherein the dedicated feed forward capacitor is connected between the first and second resistors.

10. A switch according to claim 6, wherein the FET is a single gate FET.

11. A switch according to claim 6, wherein the FET is a multi-gate FET.

12. A radio frequency (RF) switch comprising:
a plurality of field effect transistors (FETs), each having a drain terminal, a source terminal, and a gate terminal; and
a gate resistor connected to each gate terminal;
a dedicated feed forward capacitor electrically connected between the gate resistor of each of the plurality of FETs and an electrical coupling of the drain and source terminals for each of the plurality of FETs, wherein the dedicated feed forward capacitor feeds a modified RF voltage from at least one of the drain terminal and the source terminal of each of the plurality of FETs to the gate terminal through the gate resistor without affecting a DC bias voltage applied thereto.

13. A switch according to claim 12, further comprising a resistor connected between each of the drain terminals and source terminal for each of the plurality of FETs.

14. A switch according to claim 13, further comprising a gate biasing circuit and a control voltage source providing the DC bias voltage to the gate terminals through the gate biasing circuit and the gate resistor for operation of each of the plurality of FETs.

15. A switch according to claim 14, wherein the plurality of FETs is configured for a single pole double throw switching operation.

16. A switch according to claim 15, wherein the plurality of FETs comprises two switch throws with each switch throw including four FETs connected in series.

17. A switch according to claim 12, wherein each of the plurality of FETs is a single gate FET.

18. A switch according to claim 12, wherein each of the plurality of FETs is a multi-gate FET.

19. A radio frequency (RF) switch comprising:
a field effect transistor (FET) having a drain terminal, a source terminal, and a gate terminal;
a gate resistor connected to the gate terminal; and
a dedicated feed forward capacitor electrically connected between the gate resistor and at least one of the drain and source terminals, wherein the dedicated feed forward capacitor feeds a modified RF voltage from the at least one of the drain terminal and the source terminal to the gate terminal through the gate resistor without affecting a DC bias voltage applied thereto.

20. A switch according to claim 19, further comprising a voltage divider electrically connected between the drain terminal and the source terminal, wherein the dedicated feed forward capacitor is electrically connected to the voltage divider for selecting the modified RF voltage.

* * * * *